(12) United States Patent
Rueger et al.

(10) Patent No.: US 8,389,415 B2
(45) Date of Patent: Mar. 5, 2013

(54) PROFILING SOLID STATE SAMPLES (75) Inventors: Neal R. Rueger, Boise, ID (US); Mark J. Williamson, Boise, ID (US); Gurtej S. Sandhu, Boise, ID (US); Justin R. Arrington, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 285 days.

(21) Appl. No.: 12/861,543

(22) Filed: Aug. 23, 2010

(65) Prior Publication Data
US 2010/0314354 A1 Dec. 16, 2010

Related U.S. Application Data (62) Division of application No. 11/503,680, filed on Aug. 14, 2006, now Pat. No. 7,791,071.

(51) Int. Cl.
*H01L 21/302* (2006.01)
(52) U.S. Cl. .................. 438/706; 257/E21.245
(58) Field of Classification Search .................. 438/706, 438/710; 257/E21.245
See application file for complete search history.

(56) References Cited

U.S. PATENT DOCUMENTS

| | | | |
|---|---|---|---|
| 4,260,649 A | 4/1981 | Dension et al. | |
| 4,543,486 A | 9/1985 | Rose | |
| 4,579,750 A | 4/1986 | Bowen et al. | |
| 4,581,248 A | 4/1986 | Roche | |
| 4,624,736 A | 11/1986 | Gee et al. | |
| 4,655,849 A | 4/1987 | Schachameyer et al. | |
| 4,668,304 A | 5/1987 | Schachameyer et al. | |
| 4,670,063 A | 6/1987 | Schachameyer et al. | |
| 4,670,064 A | 6/1987 | Schachameyer et al. | |
| 4,685,976 A | 8/1987 | Schachameyer et al. | |
| 4,694,777 A | 9/1987 | Roche | |
| 4,735,822 A | 4/1988 | Ohtoshi et al. | |
| 4,832,781 A | 5/1989 | Mears | |
| 4,933,206 A | 6/1990 | Cox | |
| 4,938,996 A | 7/1990 | Ziv et al. | |
| 4,940,505 A | 7/1990 | Schachameyer et al. | |
| 4,980,198 A | 12/1990 | Dowben et al. | |
| 5,032,435 A | 7/1991 | Biefeld et al. | |

(Continued)

FOREIGN PATENT DOCUMENTS

| | | |
|---|---|---|
| EP | 0756318 A1 | 1/1997 |
| EP | 1363164 A1 | 11/2003 |

(Continued)

OTHER PUBLICATIONS

Abramo, M., et al., "Gas Assisted Etching: An Advanced Technique for Focused Ion Beam Device Modification", Proceedings of the International Symposium for Testing Failure Analysis, (Nov. 13, 1994), 439-446 pgs.

(Continued)

*Primary Examiner* — Quoc Hoang
(74) *Attorney, Agent, or Firm* — Schwegman, Lundberg & Woessner, P.A.

(57) ABSTRACT

Methods and apparatus may operate to position a sample within a processing chamber and operate on a surface of the sample. Further activities may include creating a layer of reactive material in proximity with the surface, and exciting a portion of the layer of reactive material in proximity with the surface to form chemical radicals. Additional activities may include removing a portion of the material in proximity to the excited portion of the surface to a predetermined level, and continuing the creating, exciting and removing actions until at least one of a plurality of stop criteria occurs.

23 Claims, 4 Drawing Sheets

U.S. PATENT DOCUMENTS

| | | |
|---|---|---|
| 5,047,649 A | 9/1991 | Hodgson et al. |
| 5,102,830 A | 4/1992 | Sandhu |
| 5,140,164 A | 8/1992 | Talbot et al. |
| 5,155,053 A | 10/1992 | Atkinson |
| 5,164,222 A | 11/1992 | Gottsleben et al. |
| 5,326,981 A | 7/1994 | Hara et al. |
| 5,356,514 A | 10/1994 | Kinoshita |
| 5,387,443 A | 2/1995 | Ota et al. |
| 5,403,433 A | 4/1995 | Morrison et al. |
| 5,419,822 A | 5/1995 | Dakesian et al. |
| 5,429,730 A | 7/1995 | Nakamura et al. |
| 5,438,019 A | 8/1995 | Sandhu |
| 5,472,935 A | 12/1995 | Yandrofski et al. |
| 5,508,368 A | 4/1996 | Knapp et al. |
| 5,622,567 A | 4/1997 | Kojima et al. |
| 5,639,342 A | 6/1997 | Chen et al. |
| 5,641,545 A | 6/1997 | Sandhu |
| 5,648,114 A | 7/1997 | Paz De Araujo et al. |
| 5,682,041 A | 10/1997 | Kawakubo et al. |
| 5,733,609 A | 3/1998 | Wang |
| 5,754,297 A | 5/1998 | Nulman |
| 5,759,923 A | 6/1998 | McMillan et al. |
| 5,800,617 A | 9/1998 | Sandhu |
| 5,807,650 A | 9/1998 | Komano et al. |
| 5,825,035 A | 10/1998 | Mizumura et al. |
| 5,834,331 A | 11/1998 | Razeghi |
| 5,942,854 A | 8/1999 | Ryoji et al. |
| 5,976,328 A | 11/1999 | Azuma et al. |
| 5,985,693 A | 11/1999 | Leedy |
| 5,989,928 A | 11/1999 | Nakata et al. |
| 6,051,287 A | 4/2000 | Marsh |
| 6,064,800 A | 5/2000 | Sandhu |
| 6,091,071 A | 7/2000 | Franz et al. |
| 6,113,751 A | 9/2000 | Morgenthaler |
| 6,143,085 A | 11/2000 | Marsh |
| 6,177,147 B1 | 1/2001 | Samukawa et al. |
| 6,187,492 B1 | 2/2001 | Ri et al. |
| 6,194,325 B1 | 2/2001 | Yang et al. |
| 6,214,183 B1 | 4/2001 | Maishev et al. |
| 6,281,072 B1 | 8/2001 | Li et al. |
| 6,291,341 B1 | 9/2001 | Sharan et al. |
| 6,309,972 B1 | 10/2001 | Pio |
| 6,310,341 B1 | 10/2001 | Todokoro et al. |
| 6,462,333 B1 | 10/2002 | Gersonde |
| 6,492,068 B1 | 12/2002 | Suzuki |
| 6,499,425 B1 | 12/2002 | Sandhu et al. |
| 6,573,199 B2 | 6/2003 | Sandhu et al. |
| 6,613,702 B2 | 9/2003 | Sandhu et al. |
| 6,661,005 B1 | 12/2003 | Bruenger |
| 6,683,005 B2 | 1/2004 | Sandhu et al. |
| 6,720,272 B2 | 4/2004 | Sandhu et al. |
| 6,730,367 B2 | 5/2004 | Sandhu |
| 6,753,538 B2 | 6/2004 | Musil et al. |
| 6,764,856 B2 | 7/2004 | Holmes et al. |
| 6,787,783 B2 | 9/2004 | Marchman et al. |
| 6,793,736 B2 | 9/2004 | Sandhu et al. |
| 6,797,337 B2 | 9/2004 | Dando et al. |
| 6,809,317 B2 | 10/2004 | Vandervorst |
| 6,811,615 B2 | 11/2004 | Sun |
| 6,838,114 B2 | 1/2005 | Carpenter et al. |
| 6,838,121 B2 | 1/2005 | Weimer |
| 6,845,734 B2 | 1/2005 | Carpenter et al. |
| 6,869,479 B2 | 3/2005 | Shafeev et al. |
| 6,897,907 B2 | 5/2005 | Morimitsu |
| 6,911,832 B2 | 6/2005 | Kolachina et al. |
| 6,927,173 B2 * | 8/2005 | Mori et al. .................. 438/710 |
| 7,012,266 B2 | 3/2006 | Jin |
| 7,113,276 B1 | 9/2006 | Higgs et al. |
| 7,122,125 B2 | 10/2006 | Deshmukh et al. |
| 7,238,294 B2 | 7/2007 | Koops et al. |
| 7,256,405 B2 | 8/2007 | Nakasuji et al. |
| 7,262,555 B2 | 8/2007 | Rueger et al. |
| 7,303,690 B2 | 12/2007 | Amemiya et al. |
| 7,311,947 B2 | 12/2007 | Dando et al. |
| 7,452,477 B2 | 11/2008 | Koops et al. |
| 7,569,484 B2 | 8/2009 | Rueger et al. |
| 7,662,648 B2 | 2/2010 | Sandhu |
| 7,718,080 B2 | 5/2010 | Rueger et al. |
| 7,791,055 B2 | 9/2010 | Williamson et al. |
| 7,791,071 B2 | 9/2010 | Rueger et al. |
| 7,807,062 B2 | 10/2010 | Williamson et al. |
| 7,833,427 B2 | 11/2010 | Rueger et al. |
| 7,892,978 B2 | 2/2011 | Williamson et al. |
| 8,026,501 B2 | 9/2011 | Williamson et al. |
| 2002/0173124 A1 | 11/2002 | Joo |
| 2002/0182542 A1 | 12/2002 | Choi et al. |
| 2003/0047691 A1 | 3/2003 | Musil et al. |
| 2003/0170389 A1 | 9/2003 | Sandhu |
| 2003/0201391 A1 | 10/2003 | Shinada et al. |
| 2004/0036398 A1 | 2/2004 | Jin |
| 2004/0043621 A1 | 3/2004 | Nasser-Ghodsi |
| 2004/0048398 A1 | 3/2004 | Liang et al. |
| 2004/0074867 A1 | 4/2004 | Han et al. |
| 2004/0091638 A1 | 5/2004 | Haight et al. |
| 2004/0097076 A1 | 5/2004 | Iyer et al. |
| 2004/0113097 A1 | 6/2004 | Marchman et al. |
| 2004/0124348 A1 | 7/2004 | Utz et al. |
| 2004/0140437 A1 | 7/2004 | Bukofsky et al. |
| 2004/0151991 A1 | 8/2004 | Stewart et al. |
| 2004/0169963 A1 | 9/2004 | Okuno et al. |
| 2005/0072753 A1 | 4/2005 | Koops et al. |
| 2005/0078462 A1 | 4/2005 | Dando et al. |
| 2005/0087514 A1 | 4/2005 | Koops et al. |
| 2005/0139291 A1 | 6/2005 | Taira et al. |
| 2005/0212092 A1 | 9/2005 | Nishizawa |
| 2005/0253093 A1 | 11/2005 | Gorski et al. |
| 2005/0266168 A1 | 12/2005 | Poullos |
| 2006/0134920 A1 | 6/2006 | Liang |
| 2006/0147814 A1 | 7/2006 | Liang |
| 2006/0154477 A1 | 7/2006 | Geng et al. |
| 2006/0183055 A1 | 8/2006 | O'Neill et al. |
| 2006/0201911 A1 | 9/2006 | Edelberg et al. |
| 2006/0228634 A1 | 10/2006 | Bret et al. |
| 2006/0255260 A1 | 11/2006 | Ludviksson |
| 2006/0276056 A1 | 12/2006 | Ward et al. |
| 2006/0288937 A1 | 12/2006 | Dando et al. |
| 2006/0289969 A1 | 12/2006 | Dando et al. |
| 2007/0015371 A1 | 1/2007 | Olynick et al. |
| 2007/0158303 A1 | 7/2007 | Nasser-Ghodsi et al. |
| 2007/0158304 A1 | 7/2007 | Nasser-Ghodsi et al. |
| 2007/0228002 A1 | 10/2007 | Geng et al. |
| 2007/0228296 A1 | 10/2007 | Mouttet |
| 2007/0257212 A1 | 11/2007 | Mouttet |
| 2007/0264831 A1 | 11/2007 | Yu et al. |
| 2007/0278180 A1 | 12/2007 | Williamson et al. |
| 2008/0006603 A1 | 1/2008 | Williamson et al. |
| 2008/0006786 A1 | 1/2008 | Williamson et al. |
| 2008/0009140 A1 | 1/2008 | Williamson et al. |
| 2008/0038863 A1 | 2/2008 | Rueger et al. |
| 2008/0038894 A1 | 2/2008 | Rueger et al. |
| 2008/0038928 A1 | 2/2008 | Rueger et al. |
| 2008/0038933 A1 | 2/2008 | Rueger et al. |
| 2009/0288603 A1 | 11/2009 | Rueger et al. |
| 2010/0221922 A1 | 9/2010 | Rueger et al. |
| 2010/0320384 A1 | 12/2010 | Williamson et al. |
| 2011/0017401 A1 | 1/2011 | Williamson et al. |
| 2011/0056625 A1 | 3/2011 | Rueger et al. |
| 2011/0139368 A1 | 6/2011 | Williamson et al. |

FOREIGN PATENT DOCUMENTS

| | | |
|---|---|---|
| JP | 09064030 A2 | 3/1997 |
| JP | 2004-257845 | 9/2004 |
| WO | WO-2008008156 A2 | 1/2008 |
| WO | WO-2008008156 A3 | 1/2008 |
| WO | WO-2008008157 A2 | 1/2008 |
| WO | WO-2008008157 A3 | 1/2008 |
| WO | WO-2008008159 A2 | 1/2008 |
| WO | WO-2008008159 A3 | 1/2008 |
| WO | WO-2008021363 A2 | 2/2008 |
| WO | WO-2008021363 A3 | 2/2008 |

OTHER PUBLICATIONS

Abramo, M. T, et al., "The application of advanced techniques for complex focused-ion-beam device modification", Reliability of electron devices, failure physics and analysis, 1996. Proceedings of the 7th europeon symposium on Oct. 8-11, 1996, Piscataway, NJ, USA, IEEE, (Oct. 8, 1996), 1775-1778 pgs.

Alers, G., et al., "Interlevel Dielectric Failure in Copper/Low-K Structures", IEEE, Transactions on Devices and Material Reliability 36, (2004), 148-152.

Fujii, Toshiaki, et al., "A nanofactory by focused ion beam", Journal of Micromechanics and Microengineering, 15(10), (2005), S286-S291.

Fujioka, H., et al., "Measurements of the Energy Dependence of Electron Beam Assisted Etching of, and Deposition on, Silica", Journal of Physics D. Applied Physics, IOP Publishing, Bristol, GB, vol. 23, No. 2, (Feb. 14, 1990), 266-268 pgs.

Golub, M., "Scanning electron microscope investigations of highly conducting organic composites", Journal of Material Sciences 36, (2001), 5543-5550.

Jonge, N., et al., "High brightness electron beam from a multi-walled carbon nanotube", Nature vol. 420, (Nov. 28, 2002), 393-395.

Liao, J. Y, et al., "Etch characterization of packaged IC samples in an RIE with endpoint detection by ICP source for failure analysis applications", Physical and failure analysis of integrated circuits, 2005, IPFA 2005. Proceedings of the 12th International Symposium on the Shangri-LA's RASA Sentosa Resort, Singapore Jun. 27-Jul. 1, 2005 Piscataway, NJ, USA, IEEE, (Jun. 27, 2005), 123-126 pgs.

Marcoux, P. J, et al., "Methods of end point detection for plasma etching", Solid State Technology, Pennwell Corporation, Tulsa, OK, US, vol. 25, (Apr. 1981), 115-122 pgs.

Numajiri, T., et al., "Sample Preparation for electron beam testing with reactive ion etching", Physical and Failure Analysis of Integrated circuits,1997, Proceedings of the 1997 6th International Symposium on Singapore Jul. 21-25, 1997, New York, USA, (Jul. 21, 1997), 56-61 pgs.

Randolph, S., et al., "Focused electron-beam-induced etching of silicon dioxide", Journal of Applied Physics, American Institute of Physics, 98, (Aug. 3, 2005), 34902-34902.

Sanchez, E. J, et al., "Ion and electron beam assisted growth of nanometric sl m on structures for near-field microscopy", Review of scientific instruments, AIP, Melville, NY, US, vol. 73, No. 11, (Nov. 2002), 3901-3907 pgs.

Teo, K., et al., "Fabrication and Electrical Characteristics of carbon nanotube-based microcathodes for use in a parallel elecron-beam lithography system", Journal of Vacuum Science & Technology B: Microelectronics Processing and Phenomena, vol. 21, (Mar. 2003), 693-697.

Wang, J, et al., "Etching characteristics of chromium thin films by an electron beam induced surface reaction", Semicond. Sci. Technol., 18, (2003), 199-205.

Wood, L., "Plasma Cleaning of Chip Scale Packages for Improvement of Wire Bond Strength", IEEE, International Symposium on Electronic Materials and Packaging, (2000), 406-408.

* cited by examiner

PROFILING SOLID STATE SAMPLES

RELATED APPLICATION

This application is a Divisional of U.S. application Ser. No. 11/503,680, filed Aug. 14, 2006, which is incorporated herein by reference in its entirety.

TECHNICAL FIELD

This disclosure relates generally to semiconductor devices and device testing, including the analysis of defects associated with microlens arrays.

BACKGROUND

Solid-state imagers typically comprise an array of pixel cells. Each pixel cell may contain one or more photosensors, which may comprise phototransistors, photoconductors, and/or photodiodes having stored charge in a diffusion region with a magnitude relative to the intensity of light received by the photosensor.

Each pixel cell may receive light focused through one or more microlenses. As the pixel cells decrease in size, the radius of each microlens may decrease. Manufacturing defects in the microlens can result in non-uniform or even blocked photosensors. Considering that the size of the microlenses are currently on the order of 3 µm or smaller, it is therefore increasingly important to reduce the number of lens defects as part of the manufacturing process. Reducing defects may increase fabrication yields, resulting in reduced pricing and improved market share.

DETAILED DESCRIPTION

Some of the disclosed embodiments provide a method for localized accelerated selective chemical etching of a solid state imager lens in preparation for profiling and problem diagnosis. In an embodiment, the localized accelerator comprises an electron beam, and the excited material comprises a halogen containing compound forming a layer on, or immediately above, the surface of the imager lens in a vacuum chamber, such as inside a scanning electron microscope (SEM). Localized electron beam assisted chemical etching provides a method of localized materials characterization that may be useful in imager lens defect analysis. This method allows for selective and/or sequential etching of various layers, and may be compared to what is known in the art as spot etching.

A variety of three-dimensional structures may be profiled, including solid state imager lenses, in an illustrative embodiment, by passing a gas phase halogen containing material over the surface of the lens in a vacuum chamber, and exciting the halogen atoms with an electron beam to form chemical radicals. By controlling the vacuum pressure and the gas flow, the mean free diffusion length of the radicals may be controlled, and etching of the lens surface may be confined to a specified region in the vicinity of an electron beam. Electrons from the primary beam, electrons scattered from the lens surface, as well as secondary electrons from the lens surface may all cause the formation of halogen radicals by dissociating the individual atoms of the halogen containing layer. The halogen containing layer may be adsorbed onto the surface of the lens, as may occur when using a base material such as xenon difluoride, which sublimates in a vacuum and may deposit on the surface of the lens.

The radicals may selectively, or non-selectively, etch portions of the lens surface, depending upon the selected combination of chemicals, and the etch products may be removed from the surface of the lens by a vacuum system pump. The surface may then be imaged with a SEM at selected intervals and the information stored for each image. Subsequent images may then be reconstructed with the earlier images to create a profile of the lens. This method provides a combination of chemical and spatial formation as a function of depth while removing layers of the lens surface.

Figure 1:
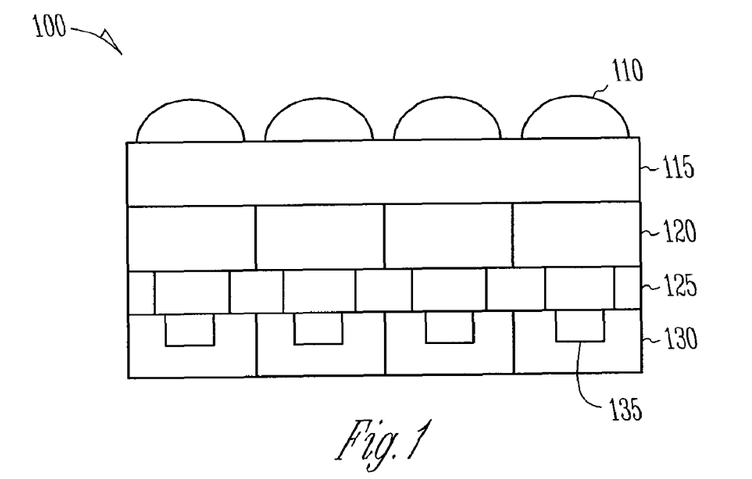
FIG. 1 shows a cross section cutaway view of a semiconductor-based imager array, according to various embodiments of the invention.

FIG. 1 shows a cross section cutaway view of a semiconductor-based imager array 100, according to various embodiments of the invention. The array of semiconductor-based imager lenses 100 may include a lens layer 110, mounted on a frame layer 115, a color filter layer 120, a mask layer 125, a pixel cell layer 130 with a photoconversion device layer 135.

Figure 2:
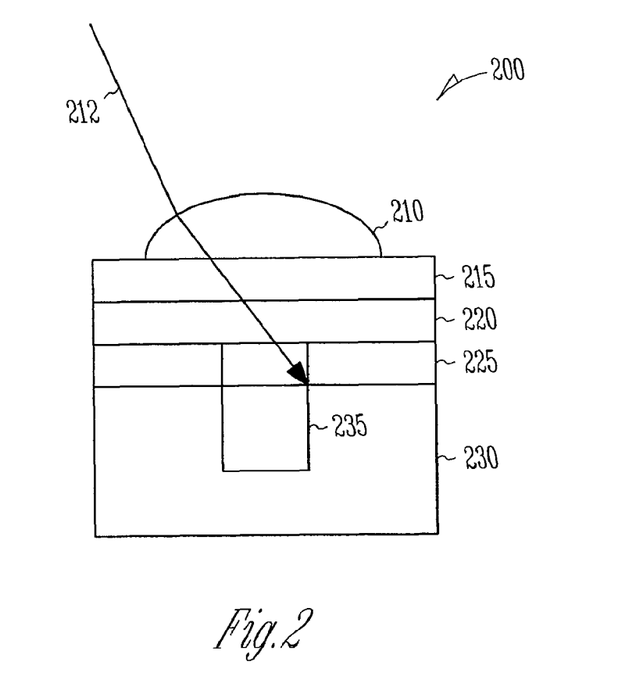
FIG. 2 is a side view of a single solid state imager located within an array similar to FIG. 1, according to various embodiments of the invention.

FIG. 2 is a side view of a single solid state imager located within an array similar to that shown in FIG. 1, according to various embodiments of the invention. The single pixel solid state photo cell 200 may include a lens layer 210, mounted on a frame layer 215, a color filter layer 220, a mask layer 225, a pixel layer 230 with a photoconversion device layer 235. Also shown is an example light ray 212 that enters the lens layer 210, is bent based upon the refraction of the lens as it passes through the subsequent layers until it reaches the photoconversion device layer 235, according to some embodiments of the invention.

Figure 3:
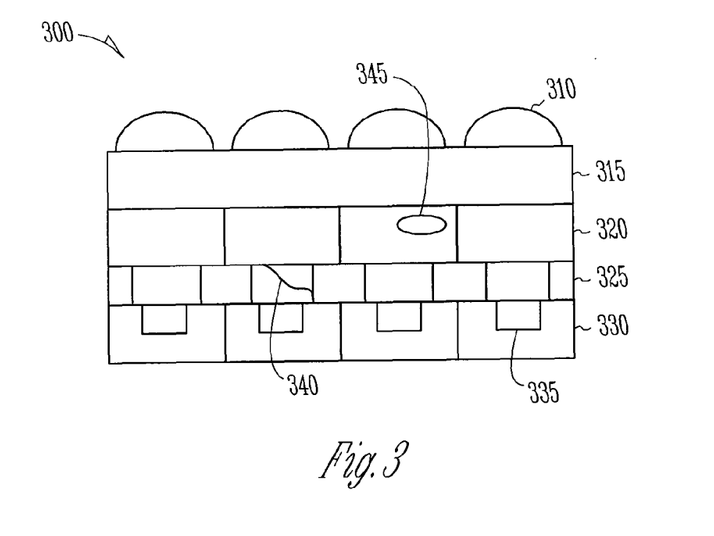
FIG. 3 shows a cross section cutaway view of a semiconductor-based imager array having defects, according to various embodiments of the invention.

FIG. 3 shows a cross section cutaway view of a semiconductor-based imager array 300 having defects similar to that of FIG. 1, according to various embodiments of the invention. The imager array 300 is shown having defects that are to be investigated using the methods of the present subject matter. Like elements are labeled similarly for clarification. The imager array 300, has a lens layer 310, mounted on a frame layer 315, a color filter layer 320, a mask layer 325, a pixel layer 330 with a photoconversion device layer 335. Example defects include an occlusion 340 in the mask layer 325 and a void 345 in the color filter layer 320.

Figure 4:
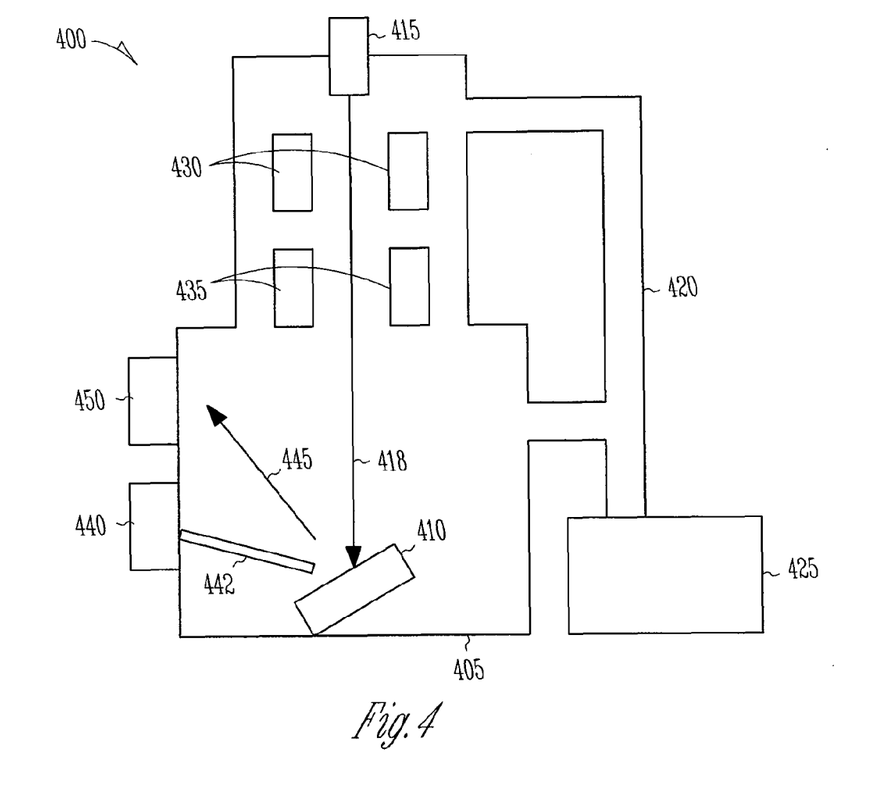
FIG. 4 illustrates a block diagram of a system for etching and profiling the surface of a solid state imager sample, according to various embodiments of the invention.

FIG. 4 shows a detailed diagram of a system 400 which includes a reaction chamber 405 with a sample 410. In one embodiment, the sample 410 may include a semiconductor-based imager array similar to that shown in FIG. 1, or other component to be analyzed. An electron source 415 is coupled to the reaction chamber 405. In one embodiment, the electron source 415 generates an electron beam 418 directed at a surface of the sample 410. In one embodiment, the electron source is a focused scanning electron beam source such as that provided in a SEM. A beam focus device 430 is included to focus the electron beam 418. In one embodiment, a scanning device 435 is further included to scan a surface of the sample 410 with the beam 418, perhaps using a raster scanning motion.

A conduit 420 or other connection is shown coupling the reaction chamber 405 to a vacuum device 425. One of ordinary skill in the art, after reading this disclosure, will recognize that the vacuum device 425 may comprise a number of possible vacuum pumps such as mechanical pumps, turbo pumps, etc., all of which are within the scope of the various embodiments. A gas supply 440 is shown coupled to the reaction chamber 405. In one embodiment, the gas supply 440 provides one or more gas species in selected amounts. In some embodiments, the gas includes a gas species to dissociate into etching and coating species. In selected embodiments, the gas supply 440 also provides additional gasses such as scavenger gasses and/or noble gasses which may be used to preferentially remove other gasses that are present within the reaction chamber 405. In one embodiment, the gas supply 440 includes controlling mechanisms and circuitry to function as an atomic layer deposition (ALD) system. For example, selected gasses can be supplied in pulses, and purge gasses or evacuation steps can be included between gas pulses. Specific gasses include, but are not limited to, $H_2$, $O_2$, noble gasses, and carbon and halogen gasses such as $CHF_3$. In one embodiment, a tube or other directing structure 442 is included to better direct the gas or gasses over the sample 410. One of ordinary skill in the art having the benefit of the present disclosure will recognize that ALD gas choice depends on the chemistry of the surface where layer deposition is desired.

A detector 450 is further included in the system 400, to detect electrons scattering from the surface of the sample 410. In one embodiment, the detector includes a secondary electron detector (not shown) for detecting secondary electrons 445. In one embodiment, the detector 450 is used to provide imaging capability to the system 400 such as in a scanning electron microscope configuration. In one embodiment, other detection capability is also included in detector 450 such as Fourier transform infrared (FTIR) detection systems, mass spectrometers, etc. for detecting and quantifying material composition. In one embodiment, a profile of the exposed surface of the sample 410 may be generated from the information collected by the detector 450 and stored in memory. In one embodiment, multiple profiles may be assembled to reconstruct the solid state imager lens after processing within the reaction chamber 405 is complete.

Methods of profiling samples of solid state imager lenses, including electron beam techniques as described above, may be implemented using a wide variety of electronic devices, such as semiconductor devices, memory, telecommunication systems, wireless systems, and computers. Further, some embodiments of electronic devices may be realized as integrated circuits.

Figure 5:
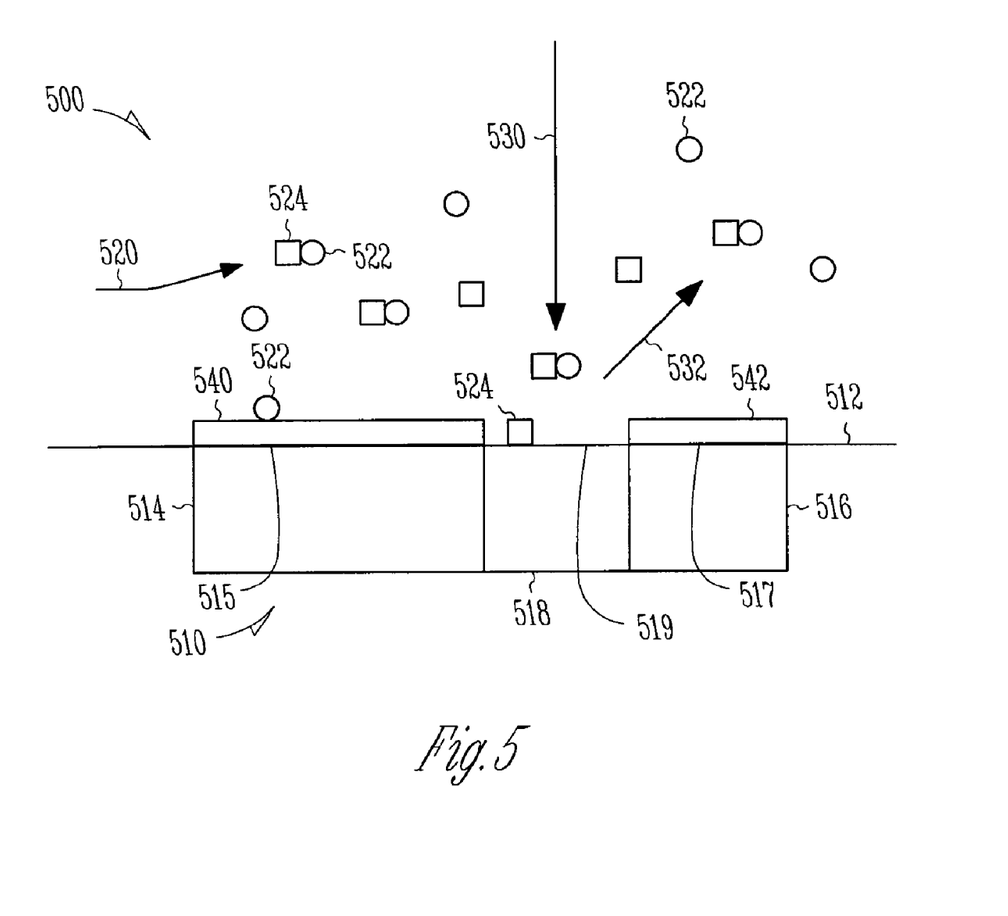
FIG. 5 shows a side view surface diagram of selective etch of a semiconductor-based imager array according to various embodiments of the invention.

FIG. 5 illustrates one example of a method using some of the examples listed above. A gas species 520 is shown in a reaction chamber over a sample 510. In one embodiment, the gas species 520 includes $CHF_3$. In one embodiment, the sample 510 includes a semiconductor-based imager lens. A first silicon region 514 and a second silicon region 516 are shown with a silicon dioxide region 518 located adjacent to the silicon regions 514, 516.

An electron beam 530 is shown directed at the sample 510. As discussed above, in one embodiment the electron beam 530 is used to image a portion of the sample 510, for example in a SEM device. Additional particles 532 are also shown that are generated as a result of the electron beam 530 interaction with the surface of the sample 510. Additional particles 532 include, but are not limited to secondary electrons and backscattered particles. In some embodiments, additional particles 532 may comprise particles which do not react with other additional particles 532.

In one embodiment, the electron beam is scanned over a surface 512 of the sample 510 and interacts with portions of the surface 512 such as silicon regions 514, 516 and silicon dioxide regions 518 during a scan. Although the electron beam 530 is indicated in FIG. 5 as a line, the diameter of the electron beam 530 can vary. In selected embodiments, the electron beam diameter is small, in the order of 1-5 nm, and a surface is scanned. In other selected embodiments, the electron beam diameter is large, in the order of over 20 nm, and a larger surface area of the sample 510 is covered without scanning. Although it is useful in selected embodiments to have the electron beam contact large regions of the sample 510, embodiments of the invention are not so limited.

FIG. 5 illustrates the gas species 520 as including a first subspecies 522 and a second subspecies 524. The illustration of two subspecies is used as an example only. In various embodiments, the gas species 520 can be broken down into more than two subspecies. In one embodiment, the gas species 520 reacts with the electron beam 530 and is dissociated into the first subspecies 522 and the second subspecies 524.

FIG. 5 shows the second subspecies 524 etching a surface 519 of the silicon dioxide region 518. Also shown are a first coating 540 on a top surface 515 of the first silicon region 514, and a second coating 542 on a top surface 517 of the second silicon region 516. In a separate reaction, one of the subspecies may also form the coatings. For example, the second subspecies 524 is shown in FIG. 5 forming the first and second coatings 540, 542.

Using $CHF_3$ gas as an example of a gas species 520, a first subspecies example may include HF and a second subspecies includes $CF_2$. In the example, the $CF_2$ subspecies may react with $SiO_2$ to form $SiOF_x$ and $CO_x$ byproducts and the $SiO_2$ surface, such as surface 519 in FIG. 5, is etched in the reaction. Further, in the example, the $CF_2$ subspecies may deposit a coating on Si surfaces such as surfaces 515 and 517 of FIG. 5. In one embodiment, the coating is deposited in a polymerization reaction. An advantage of using a carbon and halogen containing gas includes the ability to both etch and deposit a coating concurrently. Specifically with $SiO_2$ and Si surfaces present, carbon may be used in the chemical reaction to etch $SiO_2$ and the carbon further provides material to form the coating.

An advantage of forming a coating concurrent with etching includes the ability to further enhance selectivity in an etching operation. In one embodiment, the coating serves as a sacrificial coating, and further protects the coated surface from etching. As discussed above, in one embodiment, selective etching may be defined as a large difference in etch rate, with a material such as silicon etching, but at a much slower rate than another adjacent material such as silicon dioxide. The presence of a coating may further reduce or eliminate any etching of the non selected material. Enhanced selectivity provides a number of advantages including the ability to form more detailed structures with sharper edge profiles, etc.

As mentioned above, in one embodiment the coating contains both carbon and an amount of halogen such as fluorine. In one embodiment, a ratio of halogen to carbon is controlled to tailor the chemical and physical properties of the coating. This can be done by selecting different chemical species. Controlling the coating chemistry further enhances desired properties such as selective etching. In one embodiment, the ratio of halogen to carbon is 0.5:1 or lower. For example, materials with a lower ratio of halogen to carbon may provide better resistance to etching. In one embodiment, this ratio is approximately 4:1. In one embodiment, the ratio of halogen to carbon in the coating is controlled by further introducing a scavenger gas to the reaction chamber. In one embodiment, the halogen to carbon ratio is within a range of about 2:2 to about 3:1. In one embodiment, the scavenger gas is chosen to react with the halogen to form a byproduct gas that is removed from the reaction chamber by the vacuum system. In this way, the amount of halogen is reduced in the coating.

In one embodiment, the scavenger gas includes hydrogen gas ($H_2$). In a carbon-fluorine gas example, hydrogen forms HF gas, and thus reduces the amount of fluorine available in the chamber to form the coating. In one embodiment, a scavenger gas is introduced to remove other species. For example, if it is desirable to have a high ratio of halogen to carbon in a coating, a scavenger gas such as $O_2$ can be introduced to preferentially remove carbon from the system, forming $CO_x$ gases. In one embodiment, the halogen to carbon ratio is about 4:1

In one embodiment, a noble gas is further introduced to the system. Examples of noble gasses includes helium, neon, argon, krypton, xenon, and radon. In one embodiment, the addition of a noble gas further enhances the dissociation of the gas species 520 from FIG. 5 in addition to the dissociation provided by the electron beam 530. In one embodiment, the gases are pulsed to control exposure. One mechanism of enhanced dissociation from noble gasses includes electron attachment dissociation.

Figure 6:
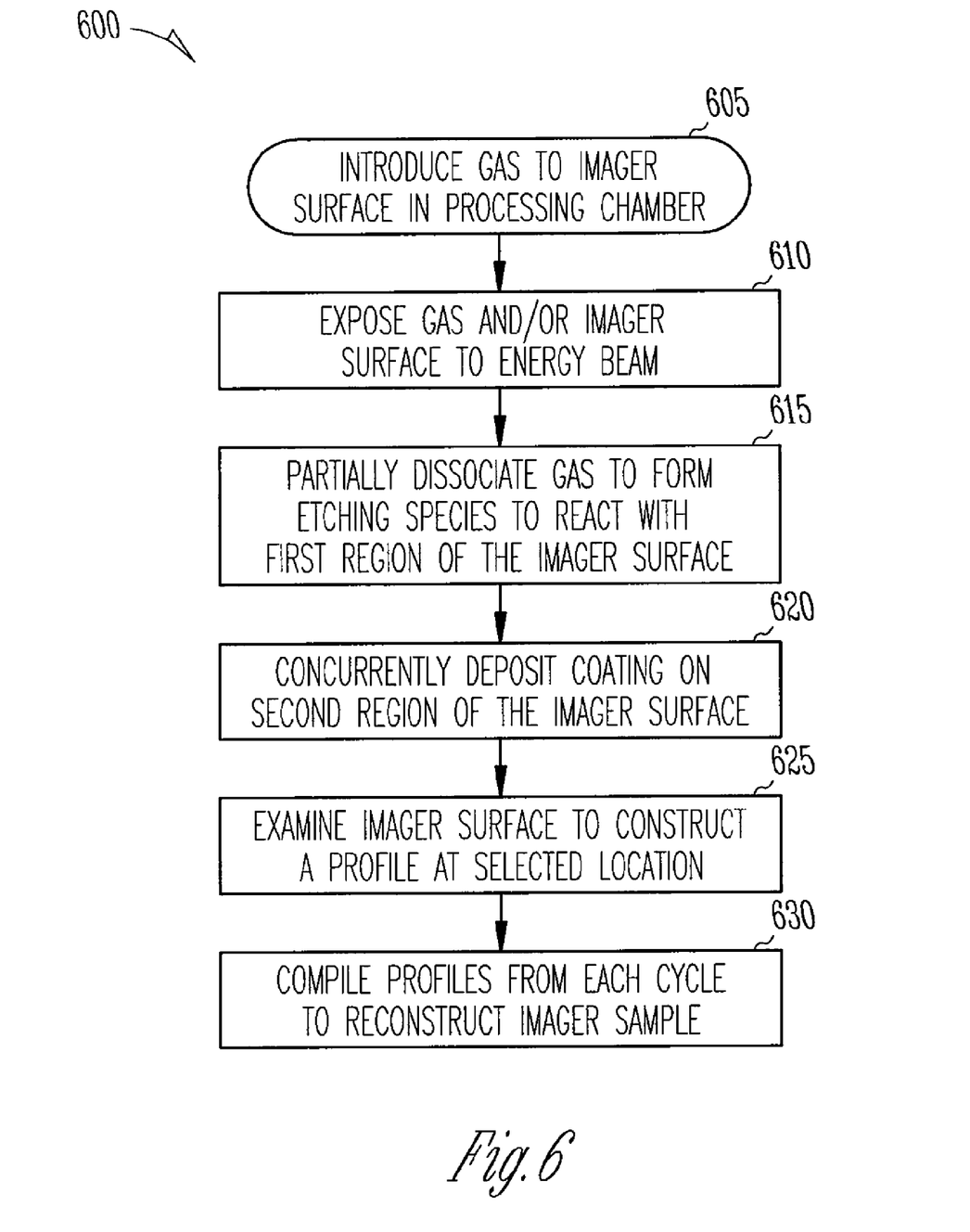
FIG. 6 shows a flow diagram of selectively etching and profiling the surface of an imager sample, according to various embodiments of the invention.

FIG. 6 shows a flow diagram 600 illustrating a method of profiling a solid state imager lens surface, according to one embodiment of the invention. In block 605, a sample imager lens surface is included within a processing chamber, and a gas is introduced. In one embodiment, the semiconductor surface includes one or more solid state imager lens arrays. One processing chamber includes an in-line production chamber where imager lenses are passed from station to station in a vacuum. In one embodiment, a processing chamber includes a chamber of a scanning electron microscope (SEM) as will be discussed in more detail below.

In one embodiment, the gas includes a gas capable of dissociating into one or more species capable of etching a region of the semiconductor surface. In one embodiment, the gas includes a gas that dissociates when exposed to energies supplied by an electron beam, including, but not limited to a beam in an SEM. In one embodiment, the gas includes a halogen species. Examples of halogens include fluorine, chlorine, bromine, iodine, and astatine. In one embodiment, the gas further includes carbon. One example of a gas that includes carbon and fluorine as a halogen includes $CF_4$. In one embodiment, the gas includes other species such as hydrogen or another element. One example of a gas including hydrogen is $CHF_3$. In one embodiment, other species in addition to carbon and a halogen include multi-component species such as a carbon and hydrogen chain, or other combinations of elements.

In block 610, the gas is exposed to an electron beam. As discussed above, in one embodiment, the electron beam is generated by an electron beam source in an electron microscope such as an SEM. The electron beam can be focused upon a sample surface using electromagnetic lenses. In some embodiments, the SEM configuration also provides a system to scan the electron beam over an area of the sample surface. In some embodiments, an imaging system is further included. In one embodiment, an imaging system includes devices such as a secondary electron detector. The use of timed exposure of the electron beam can allow one to etch to a desired depth, resulting in a stop criterion which would initiate subsequent steps in the process.

One advantage of an SEM configuration includes the ability to focus on and scan only a selected portion of the sample surface such as a single imager element of a solid state imager lens array. Another advantage of an SEM configuration includes the ability to concurrently image the selected portion of the sample surface being exposed to the electron beam. The ability to image allows a user to easily select the region to be exposed to the electron beam from the bulk of the imager lens array sample surface.

In one embodiment, a material composition detection system is further included. Examples of material composition detection systems include, but are not limited to x-ray detection systems, Fourier transform infrared (FTIR) detection systems, mass spectrometers, etc. In one embodiment, a material composition detection system is used to quantify composition of a coating that is grown in conjunction with electron beam interaction.

Although an electron microscope is used as an example of an electron beam source, embodiments of the invention are not so limited. Other embodiments include an electron beam source without additional microscope elements such as lenses, raster scanning systems, secondary electron detectors, etc.

In block 615, the gas may be at least partially dissociated into a number of reactive species. In one embodiment, the energy from the electron beam provides at least a portion of the energy necessary to dissociate the gas into the number of reactive species. The exact composition of the species will depend on the gas that is used. For example, $CF_4$ gas may dissociate into a number of species such as $CF_3$, $CF_2$, and CF. One of ordinary skill in the art, having the benefit of the present disclosure, will recognize that the energy of the electron beam can be adjusted to more effectively dissociate the gas depending on the specific gas chemistry chosen.

In one embodiment, the gas is chosen such that the reactive species selectively etch a specific material on the imager lens sample surface. For example, the reactive species may be chosen to etch silicon dioxide. In one embodiment, the reactive species generated from the gas does not etch a second material such as silicon. In one embodiment, a selective reaction such as etching is determined by a large difference in reaction rate. Although a reaction may be described as occurring on one material and not on another, in one embodiment the reaction may occur on both materials, with a substantial difference in reaction rate being observed, such as a ratio of about 10:1 to about 100:1.

In block 620, a coating is deposited on a region of the imager lens sample surface, while an etching reaction occurs at substantially the same time (e.g., concurrently) on another region of the imager lens sample surface. One example includes a silicon dioxide region that is adjacent to a silicon region. In one embodiment, a coating is deposited on the silicon region while the silicon dioxide region is etched at substantially the same time. Further, in one embodiment, a coating is deposited on the silicon dioxide region while the silicon region is etched at substantially the same time. Although silicon and silicon dioxide are used as examples, embodiments of the invention are not so limited. Other solid state imager lens materials can be selectively etched or coated using appropriate gas chemistry that will be appreciated by one of ordinary skill in the art, including halogen to carbon ratios in the range of about 1:1 to about 4:1, after reading the present disclosure.

In one embodiment, the coating deposited at step 620 includes a carbon containing coating. In one embodiment, the coating includes an amount of halogen. Using such an example, the coating can be characterized using a ratio of halogen to carbon.

In block 625, the imager lens sample surface is imaged by collecting the information obtained by the detector. In one embodiment a surface topography capability is further included. In another embodiment, the imaging is initiated by a stop criterion of a prior step in the process, such as the expiration of a timed etch process, detection of the presence or absence of specific materials by a sensor, or the completion of a gas evacuation process. Examples of surface topography include profiling systems for storing an image for each processing cycle in which the sample surface is etched in a selected region to expose a defect such as a void or occlusion within the sample.

In block 630, the individual images of the surface topography are reassembled to reconstruct a three dimensional profile of the sample as it existed prior to etching or deconstruction. In one embodiment, the information collected may provide an indication of the source of a defect within the processing of the imager lens array when manufactured. In one embodiment, information collected may provide geometry and position of the defect, suggesting a time or step in the manufacturing process within which the defect was introduced. In one embodiment, the reconstructed profile comprises material that has been removed and reconstructed either mathematically or graphically.

While solid state imager lenses have been discussed in association with the various examples herein, the various embodiments are not to be so limited. Any three dimensional structure formed according to the various methods described herein may be profiled in the same manner.

Although specific embodiments have been illustrated and described herein, it will be appreciated by those of ordinary skill in the art that any arrangement which is calculated to achieve the same purpose may be substituted for the specific embodiment shown. This application is intended to cover adaptations or variations of the present subject matter. It is to be understood that the above description is intended to be illustrative, and not restrictive. Combinations of the above embodiments, and other embodiments will be apparent to those of skill in the art upon reviewing the above description. The scope of the present subject matter should be determined with reference to the appended claims, along with the full scope of equivalents to which such claims are entitled.

In the preceding detailed description, reference is made to specific examples by way of drawings and illustrations. These examples are described in sufficient detail to enable those skilled in the art to practice the inventive subject matter, and serve to illustrate how the inventive subject matter may be applied to various purposes or embodiments. References to "an", "one", or "various" embodiments in this disclosure are not necessarily to the same embodiment, and such references contemplate more than one embodiment. Other embodiments may be utilized and structural, logical, and electrical changes may be made without departing from the scope of the present disclosure. The various embodiments are not necessarily mutually exclusive, as some embodiments can be combined with one or more other embodiments to form new embodiments.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A method of profiling a three dimensional structure, comprising:
    positioning a surface of the structure within a processing chamber;
    creating a layer of reactive species in proximity to the surface;
    exciting a portion of the layer of reactive species to form chemical radicals;
    removing the portion of the surface to a predetermined level;
    continuing the creating, the exciting, and the removing until at least one of a plurality of stop criteria occurs; and
    using information and/or material from the creating, the exciting, and the removing to profile the three dimensional structure.

2. The method of claim 1, wherein the three dimensional structure includes an imager lens.

3. The method of claim 1, further comprising:
    examining the surface upon expiration of a predetermined time period after the removing.

4. The method of claim 3, further comprising:
    continuing the examining at least twice; and
    constructing a profile of the structure.

5. The method of claim 4, wherein the constructing a profile includes material that has been removed and reconstructed mathematically or graphically.

6. The method of claim 1, wherein the plurality of stop criteria include one or more of creation of an optical image of a defect, completion of a scanning electron microscope image of a defect, expiration of a predetermined elapsed time, detection of a predetermined level of material in proximity to the excited portion of the structure surface, and sensing of at least one of a plurality of materials by a subsequent analysis sensor.

7. The method of claim 1, wherein the exciting further comprises:
    directing an energetic beam near the surface of a sample to assist a reaction between the surface and the layer of reactive species.

8. The method of claim 7, wherein the energetic beam includes one or more of an electron beam, an ion beam, a laser beam, a maser beam, a microwave beam, and an x-ray beam.

9. The method of claim 7, wherein the removing further comprises:
etching an entire thickness of at least one photo resist layer.

10. The method of claim 1, wherein the removing further comprises:
removing a portion of a first material layer, wherein the surface includes an exposed portion of a second material layer below the first material layer.

11. The method of claim 1, wherein the stop criteria includes obtaining a scanning electron microscope image indicating that the surface to be evaluated is exposed.

12. The method of claim 1, wherein the reactive species comprises a halogen.

13. The method of claim 1, wherein the reactive species is a gas.

14. The method of claim 1, wherein the reactive species is xenon fluoride.

15. The method of claim 1, wherein the reactive species comprises a mixture of materials capable of reacting with one another.

16. The method of claim 15, wherein the mixture of materials comprises at least one particle that does not directly interact with at least one other particle included in the mixture of materials.

17. The method of claim 1, wherein the chemical radicals comprise a chemical etching environment disposed to remove at least one component of the layer of reactive species by chemical etching.

18. The method of claim 17, wherein the reactive material is changed as the chemical etching occurs to selectively remove different components of layer of reactive species.

19. The method of claim 17, wherein the reactive species is changed as the chemical etching occurs to selectively remove different components of the surface.

20. The method of claim 19, wherein the reactive species is changed from an etching radical to a combination of reactive materials forming a deposition radical mixture.

21. The method of claim 20, wherein the deposition radical mixture comprises at least one of $CHF_3$, $HF$, $CF_2$, $SiO_2$ and $CO_x$.

22. The method of claim 1, wherein the exciting further includes:
directing an electron beam incident to the surface of the imager lens.

23. The method of claim 22, wherein the electron beam is disposed to provide an image of the surface during the removing.

\* \* \* \* \*